(12) United States Patent
Horak et al.

(10) Patent No.: US 6,297,166 B1
(45) Date of Patent: Oct. 2, 2001

(54) METHOD FOR MODIFYING NESTED TO ISOLATED OFFSETS

(75) Inventors: David V. Horak, Essex Junction; Bernie F. Duncan, Jericho, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/296,335

(22) Filed: Apr. 22, 1999

(51) Int. Cl.$^7$ .................................................. H01L 21/00
(52) U.S. Cl. .......................... 438/712; 216/41; 216/49; 216/67; 216/79; 438/719; 438/723; 438/725; 438/737
(58) Field of Search ....................... 438/712, 719, 438/720, 723, 725, 735, 737, 742, 743; 216/12, 41, 49, 67, 79; 430/5

(56) References Cited

U.S. PATENT DOCUMENTS

| | | |
|---|---|---|
| 4,702,795 | 10/1987 | Douglas . |
| 5,082,524 | 1/1992 | Cathey . |
| 5,139,904 * | 8/1992 | Auda et al. ........................ 216/59 X |
| 5,288,569 | 2/1994 | Kook et al. . |
| 5,326,727 | 7/1994 | Lin . |
| 5,409,789 | 4/1995 | Ito . |
| 5,465,859 * | 11/1995 | Chapple-Sokol et al. ......... 216/59 X |
| 5,674,409 * | 10/1997 | Muller ................................ 216/12 X |
| 5,718,829 * | 2/1998 | Pierrat ................................... 216/12 |

* cited by examiner

Primary Examiner—William A. Powell
(74) Attorney, Agent, or Firm—Schmeiser, Olsen & Watts; William D. Sabo

(57) ABSTRACT

A method for applying a particular reactive ion etching (RIE) process environment to a substrate that reduces or reverses the nested to isolated offset such that subsequent etching will result in substantially smaller or zero nested to isolated offset is disclosed. The RIE process environment modifies an etch mask covering the substrate to adjust the widths of nested and isolated lines to compensate for a subsequent normal etch, so that the normal etch that is subsequently performed will result in zero or a very small nested to isolated offset. In a preferred embodiment, an etching component is combined with a sputtering component in a RIE processing environment to etch an etch mask. Using a RIE with this environment prior to normal etching affects the etch mask while generally not affecting the underlying substrate. The relative amounts of etching and sputtering species in the ash can be modified to selectively change the size of isolated and nested lines in the etch mask to compensate for the changes in isolated and nested lines created in the substrate by the subsequent normal etching step such that the next etching step will then cause the nested to isolated offset to be zero or a small value.

25 Claims, 12 Drawing Sheets

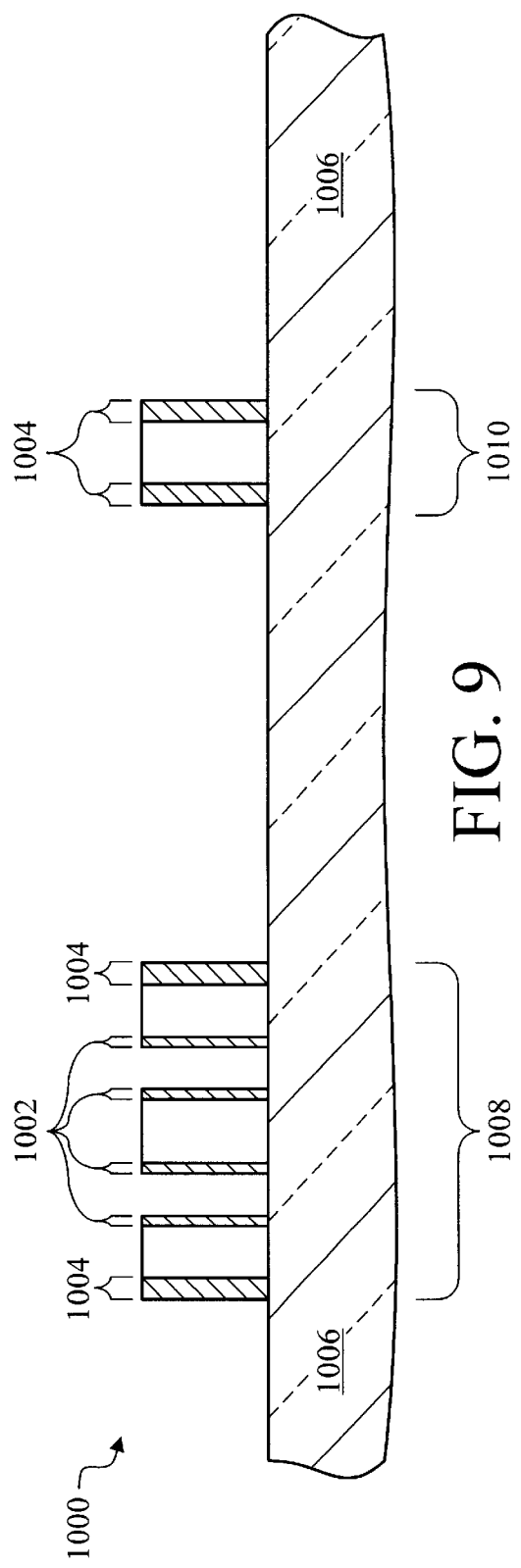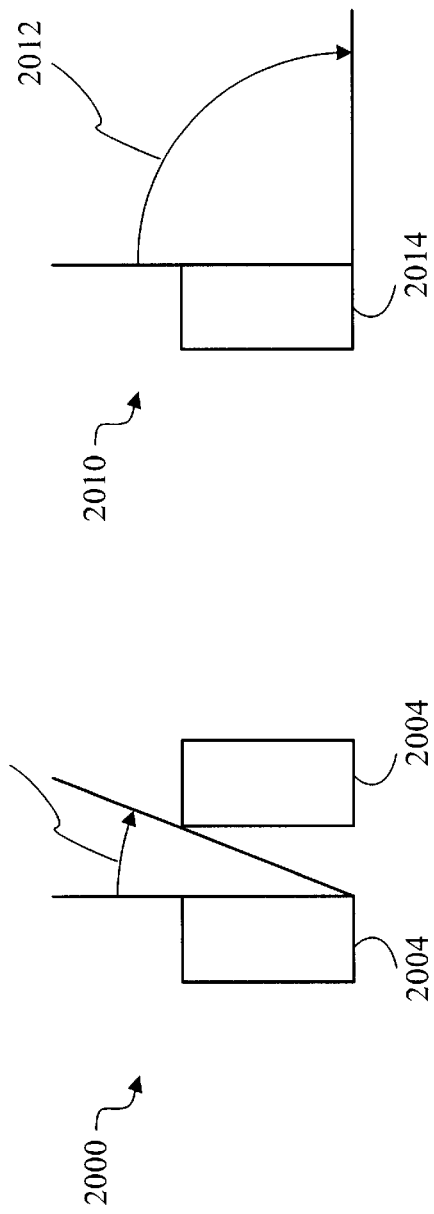
FIG. 9
FIG. 10

METHOD FOR MODIFYING NESTED TO ISOLATED OFFSETS

BACKGROUND OF THE INVENTION

1. Technical Field

The present invention relates generally to the field of semiconductor manufacturing and, more specifically, to an etch used prior to normal etching to modify nested to isolated offsets.

2. Background Art

Ideally, once a particular geometry is chosen for a particular device on a semiconductor wafer, it is desirable that all of these particular devices on the semiconductor wafer be made to the exact same geometry. Deviations in device geometry between particular devices on the same semiconductor wafer may cause one device to run too hot or "leak" carriers or run too slow: the shortest device must meet the leakage specification, while the longest device must meet the speed specification. This means that the design point for speed is determined by the slowest device and the design point for leakage is given by the device having the highest leakage.

Unfortunately, today's semiconductor processing tends to cause deviations in device geometry. This is particularly true for "nested" and "isolated" lines: these lines tend to be different sizes. A nested line is a line of material that is close to one or more other lines of material. An isolated line is a line of material that is not close to any other lines. The difference in size between nested and isolated lines is often called the nested to isolated offset. Nested lines are affected differently than are isolated lines for etching processes used today.

One reason that nested and isolated lines often have different sizes after etching is that there is some amount of lateral etching involved in most types of etching process. This lateral etching tends to affect isolated lines to a different degree than nested lines. For instance, in plasma processing, radio frequency (RF) energy is supplied to a chamber in which semiconductors lie on and are attached to the grounded surface of an electrode. A plasma is generated between this electrode and another electrode. The chemical species in the plasma are determined primarily by the source gas or gases used, although process conditions also affect the types of species in the plasma. In plasma etching, a relatively small DC voltage between the plasma and the wafer/electrode is generated. The various ions, free radicals, and neutrals (non-ionic components) that are generated in the plasma and the neutrals that are pumped into the reactor diffuse to the surface of the electrode and wafer and react with the material being etched to form volatile products that are pumped away. Pure plasma etching tends to be isotropic. This isotropic etching tends to laterally etch isolated lines more because more reactants can diff-use to the sidewalls of isolated lines.

Similarly, Reactive Ion Etching (RIE), also has unwanted lateral etching that affects isolated and nested lines differently. RIE is a type of plasma etching wherein the wafer is placed on the powered electrode and wherein a blocking capacitor is commonly also placed between the electrode and the RF power supply. RIE uses a negative DC voltage developed (by the blocking capacitor) between the plasma and wafer electrode to accelerate ions from the plasma to the wafers. In RIE, some etching occurs by free radicals, but more etching occurs by ions that are accelerated to the surface of the wafer and these ions' interactions with materials on the wafer. Although RIE is a very complex process, RIE is primarily dominated by ion-driven chemical reactions. Part of the ionic etching is by the ions that chemically react at the surface of the wafer and part is by physical removal (sputtering) of material when it is struck by the incoming ion. RIE without sidewall passivation tends to be primarily anisotropic, but will have some isotropic components (assuming no passivation, which will be discussed below). For instance, when using oxygen as a gas in a RIE with an organic material, there is always a thermal, isotropic component that causes lateral etching. In normal RIE, there will be some amount of neutral species that also contribute to isotropic components. These isotropic components can then affect nested and isolated lines differently, leading to nested to isolated offsets. In particular, because isolated lines do not have nearby neighboring lines that shield the isolated line from components that have some lateral velocity, these components (sputtering or reactive) can laterally etch isolated lines to a greater extent. In addition, both nested and isolated lines will be etched at the same time—the isolated lines are etched faster than are the nested lines, but both are etched.

These isotropic effects have been limited somewhat through certain processing steps. For instance, sidewall passivation is one method that has been used to stop the isotropic components (ions and ion-induced reactions) of RIE while allowing the anisotropic components to etch. Passivation is essentially a material added to the plasma that then "plates out" on the surface of the wafer and is designed to resist the chemical reactions occurring at the surface of the wafer. The passivation gets sputtered off the horizontal surfaces of the wafer but attaches and sticks to the vertical surfaces. Some passivation will be sputtered off the sides of lines, but it tends to cover the sides of surfaces very well. Unfortunately, passivation produces a trapezoidal or frustum-shaped device due to shadowing. In addition, passivation tends to plate out more on isolated lines than on nested lines because of shadowing, making these isolated lines larger than the nested lines for the same device. Finally, passivation causes both nested and isolated lines to increase in width.

Another method for limiting lateral etch components is to cool wafers to limit thermal isotropic components. Thus, there are methods of adjusting the plasma materials and materials/methods used on the wafer to allow some adjustment of the RIE to produce varying levels of isotropic and anisotropic etching.

Even so, there is still undesirable isotropic etching during these steps that causes differences in lateral etching between isolated and nested lines. Or, if passivation is being used, there is undesirable growth of the isolated lines without equivalent growth of the nested lines, leading to nested to isolated offsets. In addition, the isolated lines are affected more than the nested lines for both processes. Because of the different effect these processes have on nested and isolated lines, particular devices cannot be made the same size at all locations on the wafer. Thus, there will be a mixture of longer channel, slower devices and shorter channel, faster devices for these particular devices. Some devices may run too hot and leak too much, while other devices run too slow. The entire semiconductor chip, which is made of thousands of devices, then becomes limited by some particular devices that are not the correct, originally planned sizes. Engineers, who are already confronted with choices between speed (shorter devices are faster) and leakage (shorter devices also leak more), are also confronted with designing the nested to isolated offset into chips.

Therefore, without a way to ensure that nested and isolated lines are the same size after processing is complete, chip designers must take into account that there will always be limiting lines on semiconductor chips that determine the power and speed of the chip and that were not originally designed to be limiting.

DISCLOSURE OF INVENTION

Accordingly, the present invention provides a method for applying a particular reactive ion etching (RIE) process environment to a substrate that reduces or reverses the nested to isolated offset such that subsequent etching will result in substantially smaller or zero nested to isolated offset. The RIE process environment modifies an etch mask covering the substrate to adjust the widths of nested and isolated lines to compensate for a subsequent normal etch, so that the normal etch that is subsequently performed will result in zero or a very small nested to isolated offset.

In a preferred embodiment, an etching component is combined with a sputtering component in a RIE processing environment to etch an etch mask. Using a RIE with this environment prior to normal etching affects the etch mask while generally not affecting the underlying substrate. The relative amounts of etching and sputtering species in the ash can be modified to selectively change the size of isolated and nested lines in the etch mask to compensate for the changes in isolated and nested lines created in the substrate by the subsequent normal etching step such that the next etching step will then cause the nested to isolated offset to be zero or a small value.

The foregoing and other advantages and features of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

FIG. 9 is a cross-sectional illustration of lateral etching for isolated and nested lines;

FIG. 10 is an angular representation illustrating the angle of availability for a sputtering or etching component to sputter or etch isolated or nested lines for an etching process;

BEST MODE FOR CARRYING OUT THE INVENTION

Figure 1:
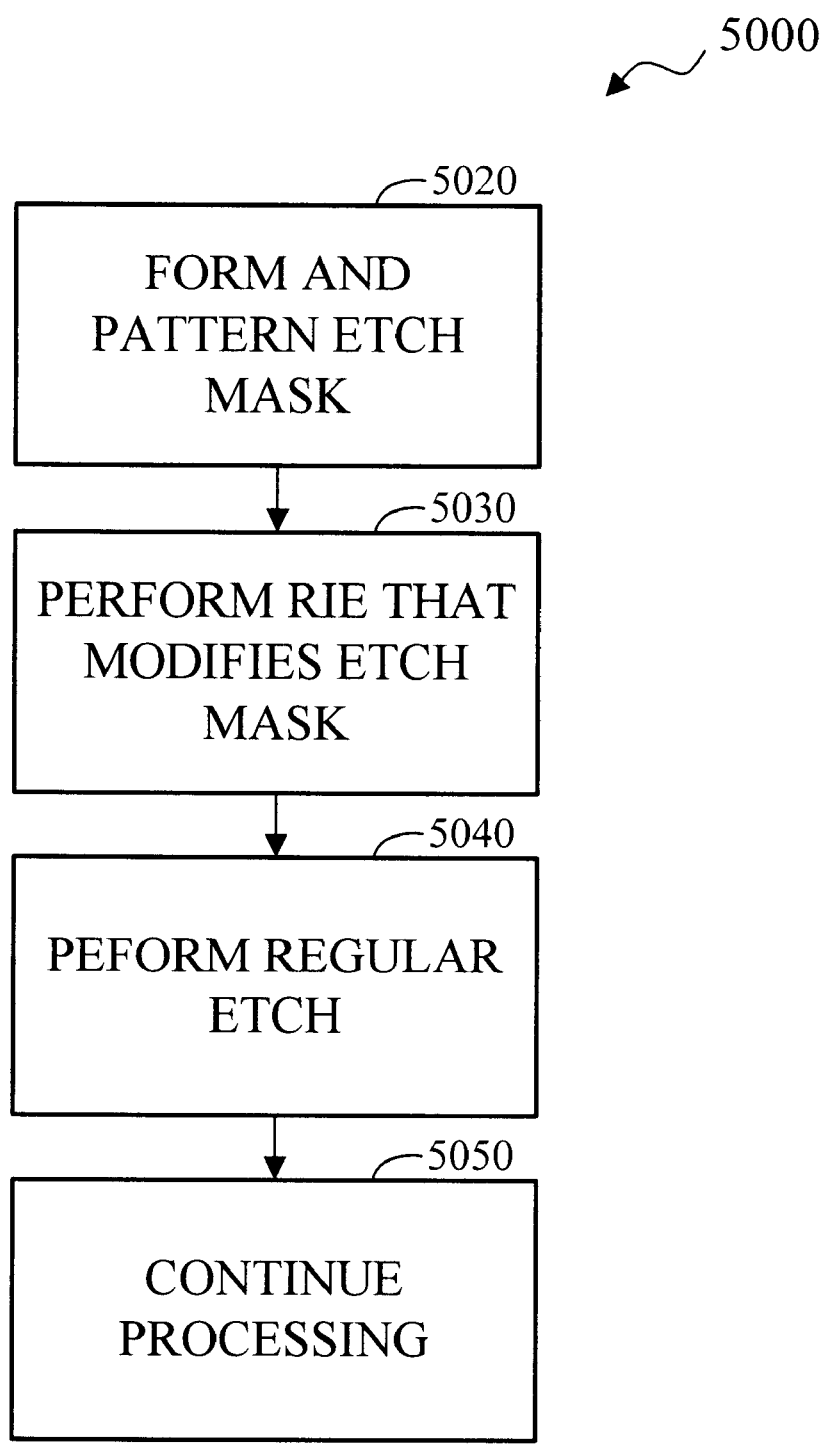
FIG. 1 is a method showing a preferred positioning of a preferred RIE step in a normal process line.

The preferred embodiments of the present invention overcome the limitations of the prior art and provide methods that furnish a Reactive Ion Etching (RIE) environment that can be adjusted to selectively reduce or reverse the nested to isolated offsets of etch mask lines on a substrate. Using this preferred etch to compensate for the changes in nested to isolated offsets caused by the main RIE step should result in low to zero etch-induced nested to isolated offsets after the main RIE step. A more in-depth discussion of nested to isolated offsets will now be given, followed by a description of the preferred embodiments.

Nested to Isolated Offsets

As stated previously, nested lines are features that are near other features, while isolated lines are features that do not have neighboring features. The space between structures is measurable. The "dividing line" between nested and isolated structures is, however, arbitrary. Even though the dividing line between the two types of structures is arbitrary, there are some "rules" that can determine whether adjacent lines are nested or isolated. For instance, structures that are separated by a space that is 1.0 F in pitch (which is the width of the smallest space or structure able to made with conventional lithography) or less are nested; structures that are separated by spaces that are 20 F or 30 F in pitch are isolated. Thus, even though the width of the space between adjacent lines that is used to determine whether adjacent lines are nested or isolated is arbitrary, there will be, on most wafers, some structures that are clearly isolated and some structures that are clearly nested.

On a semiconductor, there will usually be a continuum from lines that are very isolated to lines that are very closely packed together. Because some lines are isolated and some lines nested, reactive ion etching (RIE) with or without passivation affects nested lines differently than isolated lines. One reason for this difference is the angle of availability of the non-ionic compounds. Non-ionic (also called "neutral") compounds essentially approach the sides of lines at particular angles. Because nested lines are close together, the lines tend to shield each other from non-ionic compounds that are not approaching the nested lines at a steep enough angle.

Referring now to FIG. 9, wafer portion 1000 is shown with nested lines 1008 and an isolated line 1010 located on substrate 1006. Wafer portion 1000 is shown after RIE with no sidewall passivation. After etching, some material has been removed from the vertical and horizontal surfaces of the lines on the substrate. In this simple example, photoresist or other protective material is not shown. Isolated line 1010 is etched by a higher percentage of compounds in the plasma because more compounds that have some lateral velocity component will reach the vertical sides of isolated line 1010. This causes more material be removed from the edges of isolated line 1010. The amount of removed material is shown in FIG. 9 as isolated etch bias 1004. By contrast, nested lines 1008 have less material removed for the vertical surfaces that are close to a neighboring line. This smaller amount of removed material is represented by nested etch bias 1002. Note that the outermost edges of the nested lines are essentially "isolated" in that more etching occurs on these edges. Etch bias is defined as the difference in lateral dimension between the etched image and the photolithographic resist mask image that is caused by etching. The difference between nested etch bias and isolated etch bias is called the nested to isolated etch bias. The difference between the sizes of nested features and isolated features is called the nested to isolated offset.

Referring now to FIG. 10, nested line representation 2000 and isolated line representation 2010 illustrate a reason for the nested to isolated etch bias. Nested angle of availability 2002 represents the maximum angle a neutral compound or element can have if it is to strike the bottom of the vertical surface of nested line 2004. Note that the amount of lithographic film or other etch mask added to this line will decrease angle 2002 (e.g., a thicker layer of etch mask will cause line 2000 to be higher, resulting in a lower angle 2002). Any neutral chemical will have a horizontal velocity component that mainly results from temperature, although this horizontal velocity component may be caused by other mechanisms. If this horizontal velocity component is too high, the neutral species cannot strike the bottom of a nested line. Thus, a lower portion of neutral species, out of all the neutral species that approach nested lines, will strike the vertical surfaces of nested lines. Essentially, because there are many etching components but only some of those etching components are approaching nested lines with angles less than angle 2002, nested lines shield each other from bombardment by the etching, non-charged components.

By contrast, isolated line 2014 can be struck by many more neutral species or other etching components. As isolated angle of availability 2012 illustrates, many more etching components will approach isolated lines at an angle to etch the line. Almost any horizontal velocity component is sufficient to cause a neutral species that is close enough to the isolated line to strike the vertical surfaces of isolated line 2014.

Figure 11:
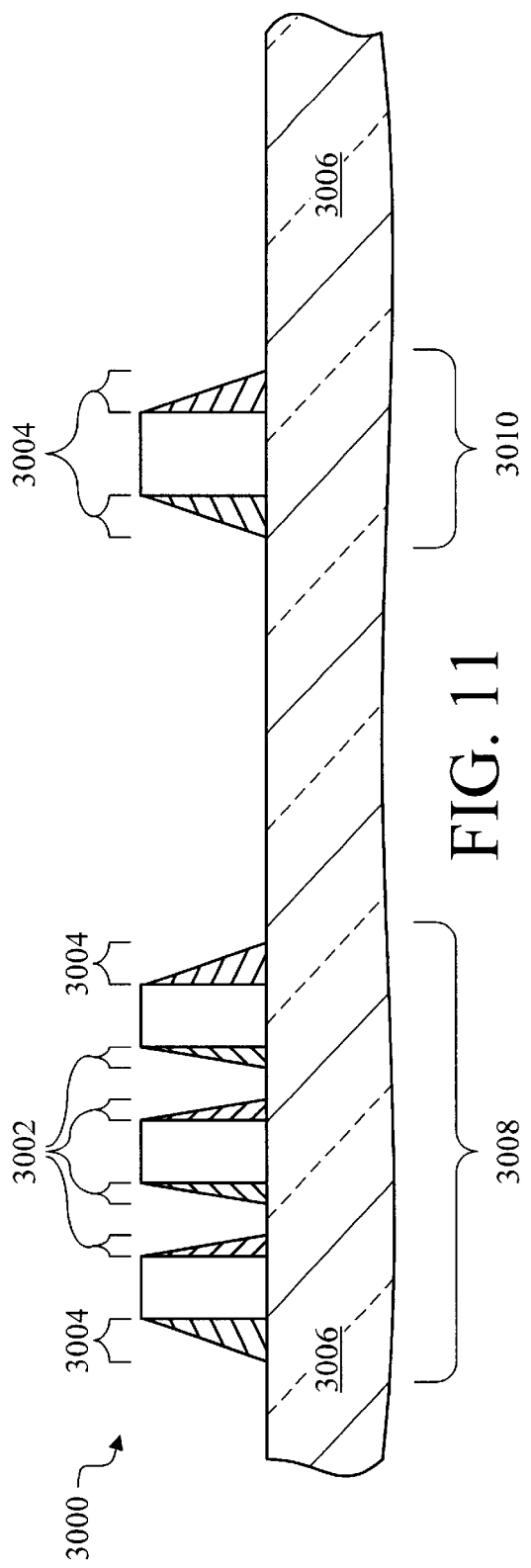
FIG. 11 is a cross-sectional illustration of passivation for isolated and nested lines.

Turning now to FIG. 11, a wafer portion 3000 that has been etched with sidewall passivation is shown. Wafer portion 3000 has nested lines 3008 and isolated lines 3010 on substrate 3006. With sidewall passivation, material bonds to the vertical sides of lines. Passivation material is added to the plasma in an effort to eliminate lateral etching. Passivation material 3002 is still less than passivation material 3004 because nested lines tend to shield each other from "bombardment" by passivation species in the plasma. Thus, nested lines tend to grow less than isolated lines. Note that the outermost edges of the nested lines are essentially "isolated" in that more plasma deposition occurs on these edges.

Figure 12:
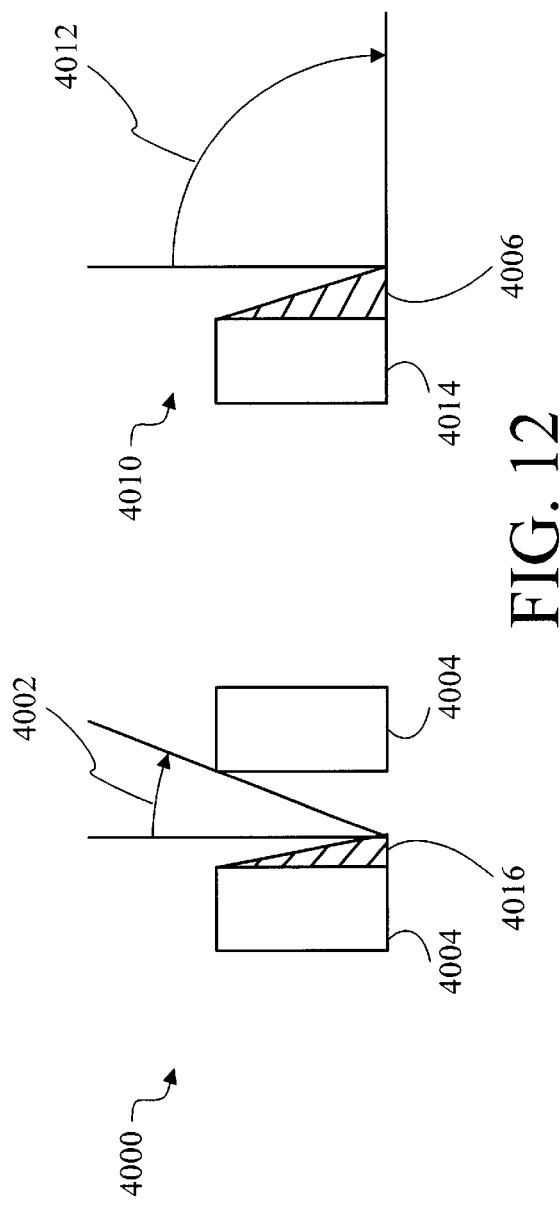
FIG. 12 is an angular representation illustrating the angle of availability for a sputtering or etching component to sputter or etch isolated or nested lines for RIE with passivation.

Referring now to FIG. 12, nested line representation 4000 and isolated line representation 4010 again illustrate that a smaller portion of plasma species will strike vertical sides of nested lines 4004 than strike the vertical sides of isolated line 4014. Because passivation generally does not form evenly in the horizontal direction, nested angle of availability 4002 will usually be smaller than nested angle of availability 2002 (where there is no passivation). Nested passivation 4016 illustrates that less passivation reaches the sides of nested structures 4004 than reaches the sides of isolated structure 4014. Isolated angle of availability 4012 will be a much higher angle. Thus, more passivation material 4006 will be added to isolated lines 4014 than to nested lines 4004.

FIGS. 9 and 11 illustrate that RIE changes both nested and isolated lines at the same time. In addition, isolated lines are affected more than nested lines are. For instance, FIG. 9 shows that isolated lines decrease in width more than the nested lines decrease in width. In FIG. 11, the isolated lines increase in width more than the nested lines increase in width.

Figure 13:
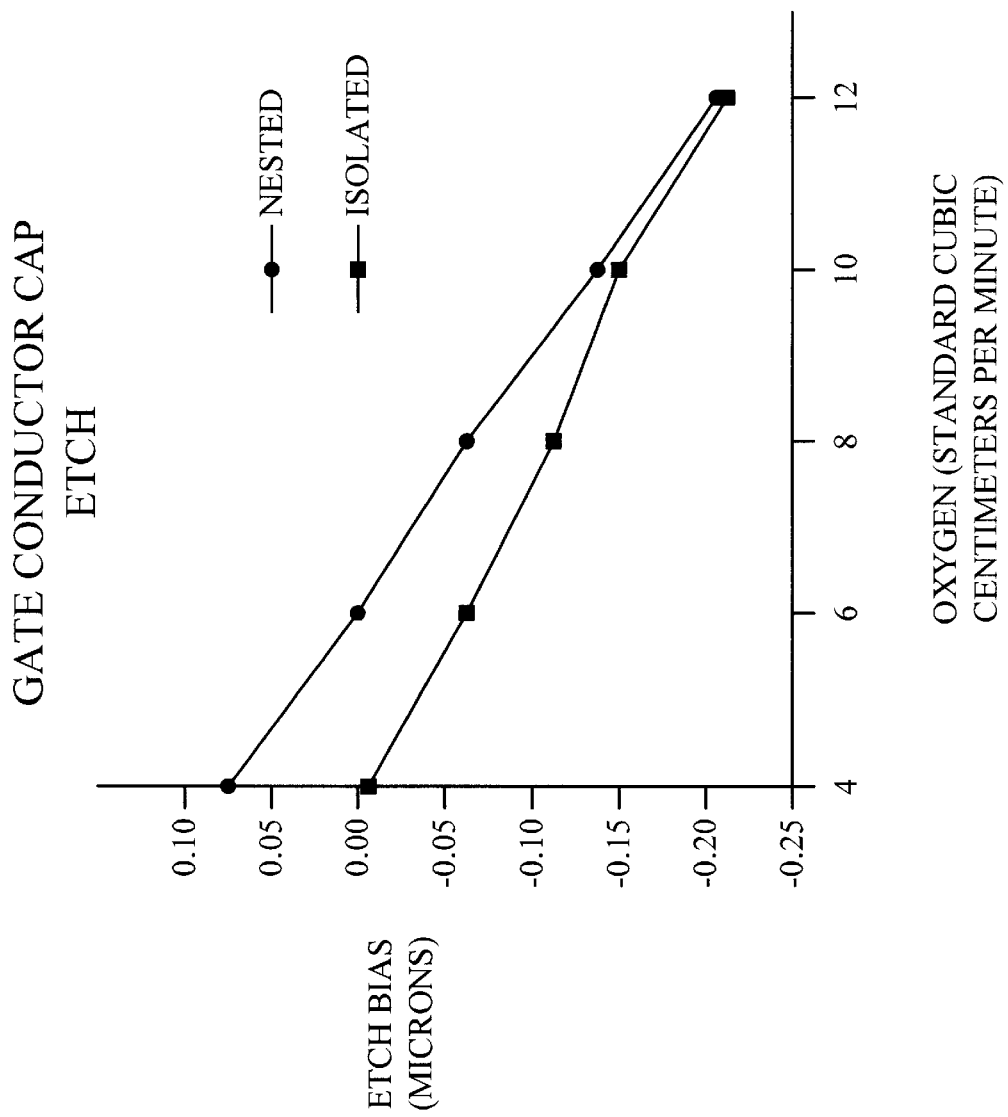
FIG. 13 is a graph showing how nested to isolated etch bias changes by oxygen component level for a gate conductor cap etch using a reactive ion etching process.

Turning now to FIG. 13, a Gate Conductor Oxide (GC) Cap etch is shown for a wafer as a function of oxygen. The GC Oxide Cap is the "cap" (e.g., of insulating material) deposited over a gate conductor layer. This RIE is a normal etch in a semiconductor line that could be used to etch the GC oxide cap. The RIE etch used to take these measurements was an etch having $CHF_3$, argon, and oxygen. A single batch of wafers was used to derive the data. The size of nested and isolated lines was determined after the RIE was performed at the indicated oxygen levels. It can be seen that the etch bias, expressed as a percent of actual image, decreases for both nested and isolated lines. While the nested to isolated offset decreases, this decrease comes at a tremendous expense: both nested and isolated lines have shrunk a great deal. For most devices on a wafer, this would have deleterious if not disastrous effects.

Figure 14:
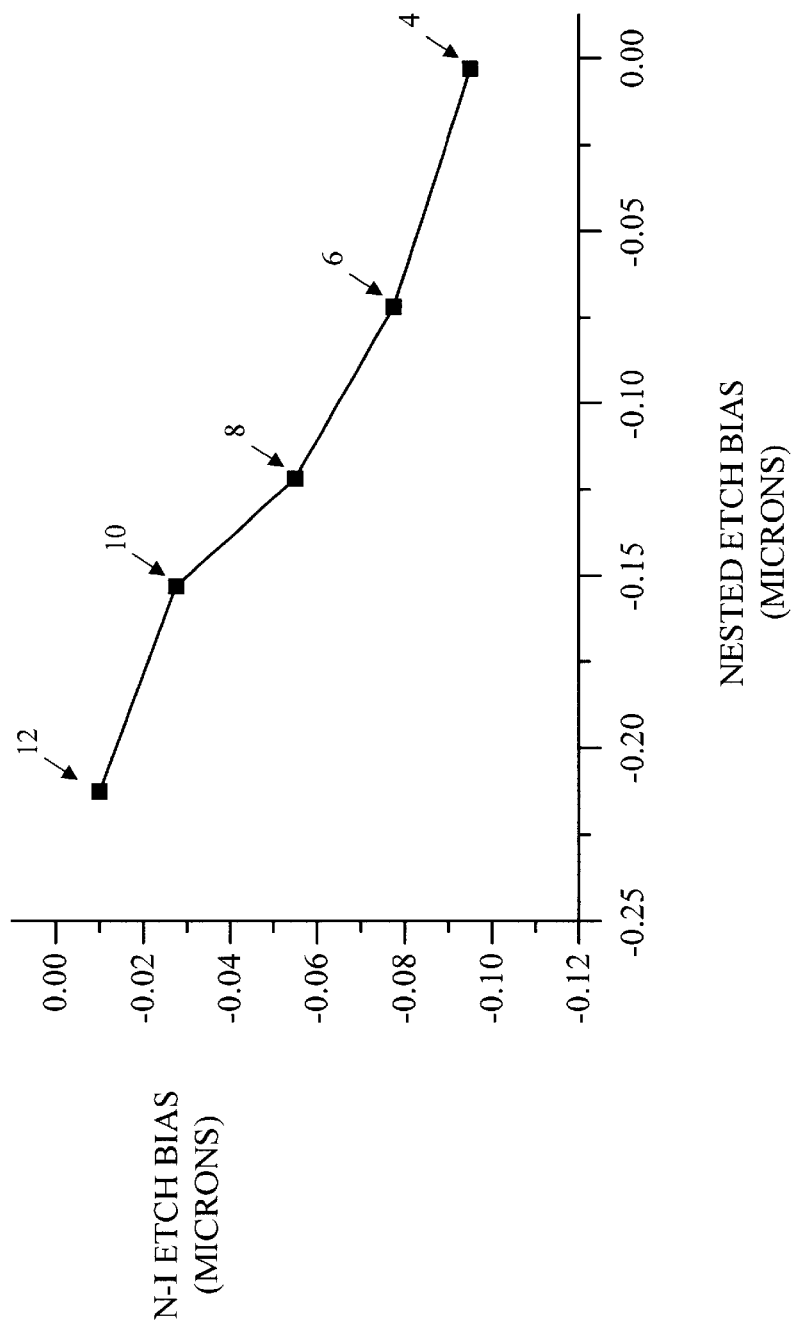
FIG. 14 is the data of FIG. 13 plotted to show nested to isolated etch bias for a gate conductor cap etch using a reactive ion etching process.

Referring now to FIG. 14, nested to isolated etch bias, which is the difference in etch bias between nested and isolated lines, is compared to nested etch bias for various oxygen flow values. These data are essentially the data from FIG. 13 plotted in a different manner. FIG. 14 shows that, as oxygen flow rates increased, the nested etch bias decreased and the nested to isolated etch bias also decreased. The slope of the curve is negative, meaning that the nested to isolated etch bias cannot be adjusted without causing nested etch bias to also decrease.

Preferred Embodiments

The preferred embodiments of the present invention provide a separate Reactive Ion Etch (RIE) prior to normal etches. This separate RIE generally uses a mixture of an ionic, sputtering component and an etching component to selectively increase or keep relatively constant the widths of etch mask lines while the widths of nested etch mask lines decrease. This special etch primarily affects etch mask material (e.g., any patterned material formed to etch an underlying similar or different substrate layer) that covers the surface of the substrate without usually affecting the substrate underlying the etch mask. Few if any modifications to the main, normal etch are required. The sputtering and etching components and other etch conditions may be adjusted in the etch of the present invention to provide a reduction in the width of etch mask isolated lines or a growth or reduction in the width of etch mask nested lines. These changes in isolated and nested etch mask lines compensate for the etch biases in substrate lines caused by a subsequent normal etch. Thus, the etch of the present invention is used in conjunction with the subsequent normal etch step to reduce nested to isolated offsets.

In the most preferred embodiment of the present invention, photoresist and ARC material (if used) as lithographic films are exposed to a combination of a strong sputtering component (e.g., argon or nitrogen) in combination with an isotropic chemical etch. The etching agent is oxygen, which is an ashing component ("ash" generally refers to reacting oxygen with organic materials in a RIE). Essentially, this special etch tailors the photoresist and ARC material (if used) prior to the normal etch. The normal etch creates lines in the substrate underneath lithographic film lines that exist on the surface of the substrate. The normal etch creates etch biases in the lithographic film lines and substrate lines. For normal etches using particular conditions (etching and sputtering materials, power levels, gas flow rates, etc.), the etch biases are known. The special etch of the present invention is performed prior to the normal etch, and the special etch adjusts the nested and isolated lithographic film lines prior to the normal etch to compensate for the etch biases of the normal etch. The combination of the two etches should decrease the nested to isolated offsets of lines formed in the substrate. The current invention will be described mainly in reference to the most preferred embodiment, and other preferred embodiments will be described briefly below. Data taken before and after the special etch step will also be discussed below.

It should be noted that the spacing between lines on a wafer is actually a continuum. There will some lines that are very close together, some that are slightly farther apart, some that are even farther apart, etc. RIE tends to interact with these lines that have different spaces between them in an even manner. For instance, the angle of availability will change slightly for each increase in spacing between lines; this slight change in angle allows more lateral etching of these slightly-farther-apart lines. Thus, lines tend to be affected evenly by RIE across the continuum of spacings. To put this another way, etch bias as a function of space between lines for RIE is very nearly or exactly linear. This means that offsets caused by normal RIE may be substantially eliminated and compensated for by the current invention because the special RIE of the present invention also evenly affects lines across the continuum of spacings. The current invention uses similar chemistries and thus is also affects nested to isolated etch biases linearly across the continuum of spacings.

For offsets caused by lithography, however, the current invention will adjust nested to isolated offsets but may not completely compensate for lithographic offsets across the entire continuum of spacings. The reason for this is that lithography tends to affect differently spaced lines differently (not the same). Because of the physics of lithography (optics, diffraction, interference, etc.), lines that are spaced closer together may not be affected in the same manner as lines that are spaced farther apart. For instance, once lines reach a certain distance from other lines (which is about 0.8 micrometers ($\mu$m) for some resists), lithography is almost ideal in the sense that the printed image is very close to the actual image. At shorter distances between lines, however, the printed image deviates from the ideal image. Thus, while actual lines that are spaced farther apart are very nearly the size of the ideal image, actual lines that are closer together are not ideal. Another way of putting this is that lithographic bias as a function of space between lines for photolithography is nonlinear. While the RIE of the present invention will beneficially affect nested to isolated offsets, there may not be complete compensation for lithographic biases and offsets across the continuum of spacings.

Figure 2:
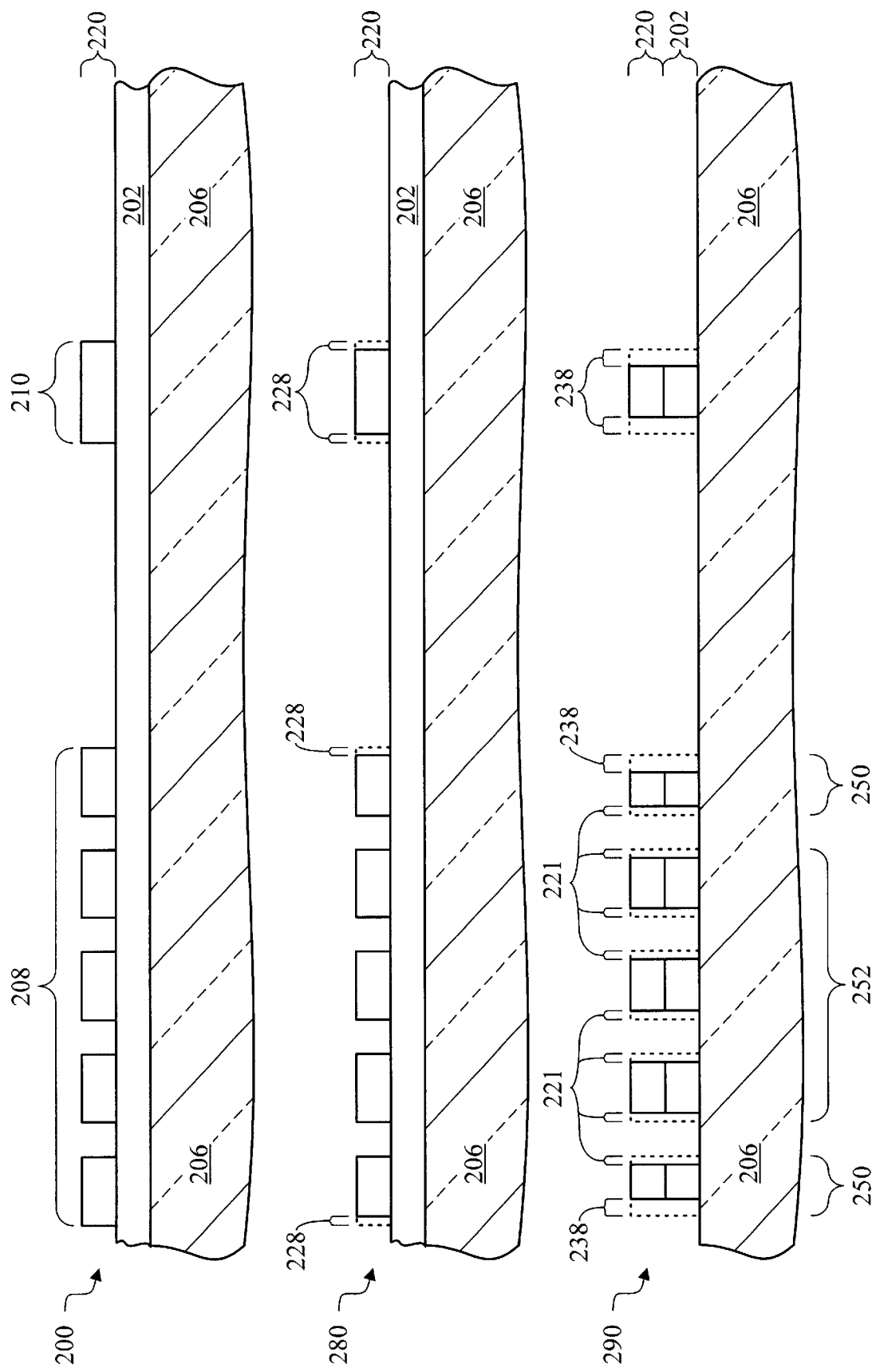
FIG. 2 is a series of three cross-sections of a substrate shown at certain processing steps while performing the method of FIG. 1 in accordance with a preferred embodiment of the present invention.

Turning now to FIGS. 1 and 2, FIG. 1 shows a method 5000 for using a RIE in accordance with a preferred embodiment of the present invention. FIG. 2 shows three cross-sections of a substrate, each cross-section illustrating what a substrate might look like after particular steps in method 5000 of FIG. 1 have been performed. Method 5000 illustrates a preferred method of integrating the special etch of the present invention into a normal processing line that uses normal RIEs to etch wafers. The etch of the present invention is preferably performed prior to the normal RIE; this allows the etch of the present invention to compensate for changes in etch bias caused by the normal RIE. The etch of the present invention compensates for the normal RIE by adjusting nested to isolated offsets of etch mask lines prior to the normal RIE, which then etches the substrate in a normal manner. Compensation is performed by the etch of the present invention so that the final etch-induced nested to isolated offset will be small. Thus, the etch of the present invention and the normal RIE cooperate to produce the beneficial result of little to no nested to isolated offset.

Method 5000 of FIG. 1 begins when an etch mask is formed and patterned (step 5020). The etch mask will be used to etch the substrate or layers on the substrate. In the most preferred embodiment, the etch mask is a lithographic film (a film responsive to light, such as photoresist or anti-reflective coating (ARC)). Other etch masks will be discussed below. It must be noted that method 5000 is a small portion of the many steps actually involved in the processing of semiconductors. Method 5000 simply illustrates one approximate location in the entire process where the embodiments of the current invention could be applied.

After the etch mask has been formed and patterned, a cross-section similar to cross-section 200 in FIG. 2 should result. Cross-section 200 shows a patterned etch mask layer 220 formed on a layer 202 of substrate 206. Etch mask layer 220 has been formed and patterned in order to pattern layer 202 during subsequent etching steps. The etch mask could also be used to pattern substrate 206 directly instead of patterning layer 202. In the most preferred embodiment of the present invention, the etch mask is a patterned lithographic film. (photoresist and/or ARC material) Etch mask 220 comprises an isolated line 210 and some nested lines 208. The etch mask could be used to form gates for Complementary Metal Oxide Semiconductors (CMOS), to form metal lines or runs to connect devices, or for any other reason that such lines are formed. In this example, isolated line 210 has a width that is greater than the widths of individual nested lines 208. For many etch masks (in particular, positive photoresist), isolated lines will generally be wider than equivalent nested lines.

Next, the special etching step of the present invention is used to modify the etch mask in step 5030 of FIG. 1. The modified ashing step of the present invention affects the etch mask to adjust the sizes of the nested and isolated lines. Ideally, the etch of the present invention should not affect the underlying substrate (although this may be performed if desired). The parameters of the modified ashing etch may be changed to suit the particular processes being performed (this will be discussed below).

Cross-section 280 of FIG. 2 illustrates an example of a substrate after the etch of the current invention. In cross-section 280, the widths of the nested etch mask lines 208 have (for the most part) not been changed, but the width of the isolated etch mask line 210 has been reduced by etch bias 228. The "isolated" areas of the nested lines, e.g. the edges of nested lines where there are no neighboring lines to provide a shadowing effect, are changed. In other words, the etch mask lines on the "outside" of a group of nested etch mask lines will have some etch bias. However, the majority of nested etch mask lines remain the same width. The etch of the present invention can also increase the width of the nested etch mask lines while still decreasing the width of the isolated lines.

When the regular etch is performed in step 5040, the nested to isolated offset for these particular devices should be zero or small. Because the normal etch creates biases that are known beforehand, the etch of the present invention can be made to compensate for these known etch biases. This is illustrated in FIG. 2, as cross-section 290. This cross-section shows that the normal etch created larger isolated etch biases 238 for isolated line 210 than the nested etch biases 221 created for nested lines 208. The normal etch, thus, decreased the width of the isolated line more than the width of the nested lines. The reasons for this discrepancy in etch biases between nested and isolated lines have been discussed in the Overview section in regard to FIGS. 10 and 11. Cross-section 290 shows that nested lines 252 are the same width as isolated line 210. However, the lines 250 on the outside of nested groups (such as the group made of nested lines 208) may be slightly smaller in width than the interior nested lines of the group (lines 252). If this slight difference in width is not desirable, outside lines 250 can be chosen as the limiting lines, and the conditions of the etch of present invention modified to make these lines the same width as isolated line 210. For instance, nested lines 208 could be made to grow during the etch of the present invention; this would add material to the edges of lines 250 that are facing a nested neighboring line 252. Even if the outside edges of lines 250 would lose material during the etch of the present invention, the additional material on the inside should effectively counteract this loss.

Processing can then continue on the wafer in step 5050. Such processing could include removing the etch mask, depositing oxide, etc.

Thus, the current invention places an additional step in a normal processing line or method that modifies the etch mask prior to the normal etch to compensate for the normal etch's effect on nested to isolated offsets. In the most preferred embodiment, oxygen is used as an ashing component that etches an organic lithographic film. The oxygen, as an ashing component, will etch the lithographic film but should not etch the underlying line (of metal, oxide, silicon, etc.). There may be some sputtering of the underlying lines by the sputtering component (e.g., argon in the most preferred embodiment), however, which may affect the underlying lines slightly. In addition, the surface of the substrate (layer 202 in FIG. 2) may be etched somewhat by the sputtering component. The normal etching step will then result in zero to very low nested to isolated offsets.

To integrate the modified ashing step into a process line, it will usually be necessary to determine the nested to isolated offsets for particular lines of certain sized devices on the wafer. Most wafers will have many layers of lines on them, and the lines in each layer may be many different sizes. The current invention may be applied to each etching step, or may be applied only to etching steps that affect the "important" lines on the wafer. For instance, if there is a layer where there are only large lines, the nested to isolated offsets of which are unimportant, then the modified etching step of the current invention need not be applied. If, however, the current layer has small lines where the nested to isolated offset is important to ensure that all lines for certain devices act the same or have the same properties, then the ashing etch of the present invention may be applied prior to a normal etch to lower the nested to isolated offset.

Figure 3:
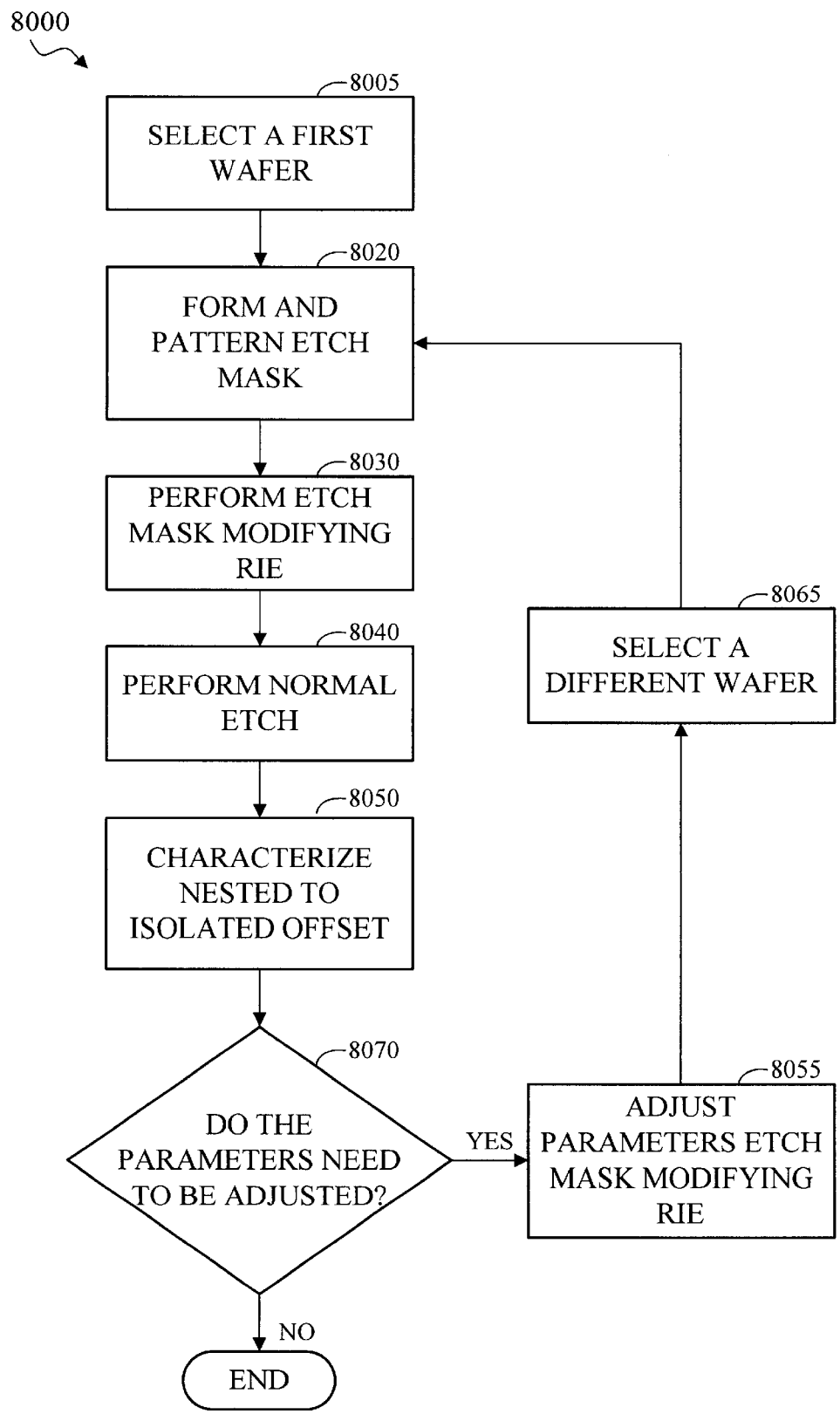
FIG. 3 is a preferred method of determining ashing parameters for a preferred embodiment of the present invention.

Turning now to FIG. 3, a method for integrating the special etch of the present invention into a process line is shown. Method 8000 is performed to adjust the parameters of the special etching step of the present invention so that the regular step of etching a layer will reduce the nested to isolated offset for most lines of a particular device to zero or some small value. There are many variables that affect the nested to isolated offset, such as the type of resist used, the normal RIE being used, the RIE parameters used for both the normal and special RIE, etc. It is preferred that the parameters of the special etch of the present invention be adjusted by testing a number of wafers on the special RIE and the normal RIE, and then adjusting the parameters of the special etch of the present invention based on the nested to isolated offset that results. By integrating the current invention into the process this way, the many variables involved with producing nested to isolated offsets can be tuned to reduce the etch-induced nested to isolated offset to zero.

Method 8000 begins when a first wafer is selected from a batch of wafers that have been processed up to the point when an etch mask is going to be applied and then the wafer etched. The etch mask is formed and patterned in step 8020. In the most preferred embodiment of the present invention, the etch mask is a lithographic film (photoresist and/or ARC) that has been applied and patterned. If using lithographic films as an etch mask, additional processing may be performed in this step to add additional or different lithographic film(s) to the substrate. For instance, ARC could be added prior to adding positive photoresist. In step 8030, the special etch of the present invention is performed with a particular set of values. The etch conditions for the most preferred embodiment are described below. Subsequently, the normal etch for the layer is performed (step 8040). The nested to isolated offset is characterized in step 8050. This step will generally be performed by measuring the nested to isolated offset for particular lines of interest. These lines will usually be the most limiting lines on the layer for particular devices (e.g., where having a zero or low nested to isolated offset is important for speed, leakage, or other conditions), although the method of the present invention will modify all nested to isolated offsets. Note also the outside lines 250 of FIG. 2, wherein the outside lines of nested groups may be a slightly different size than interior nested lines; these outside lines could also be the most limiting lines. Measurements will normally be taken through methods such as Scanning Electron Microscopes (SEMs).

Once the measurements of the particular lines of interest have been taken and compared to previous values, a determination may be made to adjust the parameters (step 8070). If the nested to isolated offset is not zero or a low enough value, then the parameters for the special etch of the present invention may be adjusted in step 8055. Examples of the types of parameter changes that may be made in step 8055 will be given below. In general, however, once the particular parameters and chemistries have been determined for a particular line, the time of etch is the only parameter that need be tuned to adjust the nested to isolated offsets. One preferred set of parameters will be discussed below. If changes to the etch of the present invention are necessary, another wafer from the same batch of wafers is selected (step 8065) and steps 8010–8070 are performed again until the nested to isolated offset reaches the preferred small amount.

In addition to adjusting the parameters of the special etch of the present invention, other parameters may be adjusted in method 8000. For instance, the etching parameters of the RIE in step 8040 may also be adjusted. However, because there is an interrelationship between the etch mask (photoresist layer or layers or ARC material in the most preferred embodiment of the present invention), normal RIE step, the material being etched, etc. and the nested to isolated offset, changes to steps that do not involve the etch of the present invention will generally necessitate some change in the parameters of the etch of the present invention. Thus, it is recommended that all steps other than the special etch of the present invention (step 8030) remain fixed while performing method 8000.

After the etch of the present invention is completed, the relative size of nested and isolated lines should be changed from the relative sizes of the lines at the start of the procedure. The relative sizes will be different because the etch mask (ARC, or other lithographic film in the most preferred embodiment) will be rearranged or re-aligned. This rearrangement generally occurs without affecting the underlying lines.

For instance, in the most preferred embodiment of the present invention, argon and oxygen are used in a RIE environment to selectively adjust the widths of lines of lithographic film. The argon in the environment acts to enhance the ionic, sputtering component, while the oxygen acts as an ashing or lateral etching component. At lower oxygen concentrations, there will be a higher amount of sputtering components and a lower amount of ashing components. This combination of argon and oxygen can actually make nested lithographic lines grow while making isolated lithographic lines shrink. It appears that the sputtering that occurs around nested lithographic lines rearranges the photoresist and ARC, causing these materials to be removed from other lithographic, nested lines and placed onto nearby nested lithographic lines. Conversely, with little to no other neighboring lines in the vicinity, sputtering of isolated lines tend to remove material from the isolated lines.

As oxygen levels increase, the sputtering that takes place around nested lines is balanced by the ashing component of the oxygen. Even though sputtering is still occurring, there is more loss than gain for nested lines and these lithographic lines begin to shrink.

Figure 4:
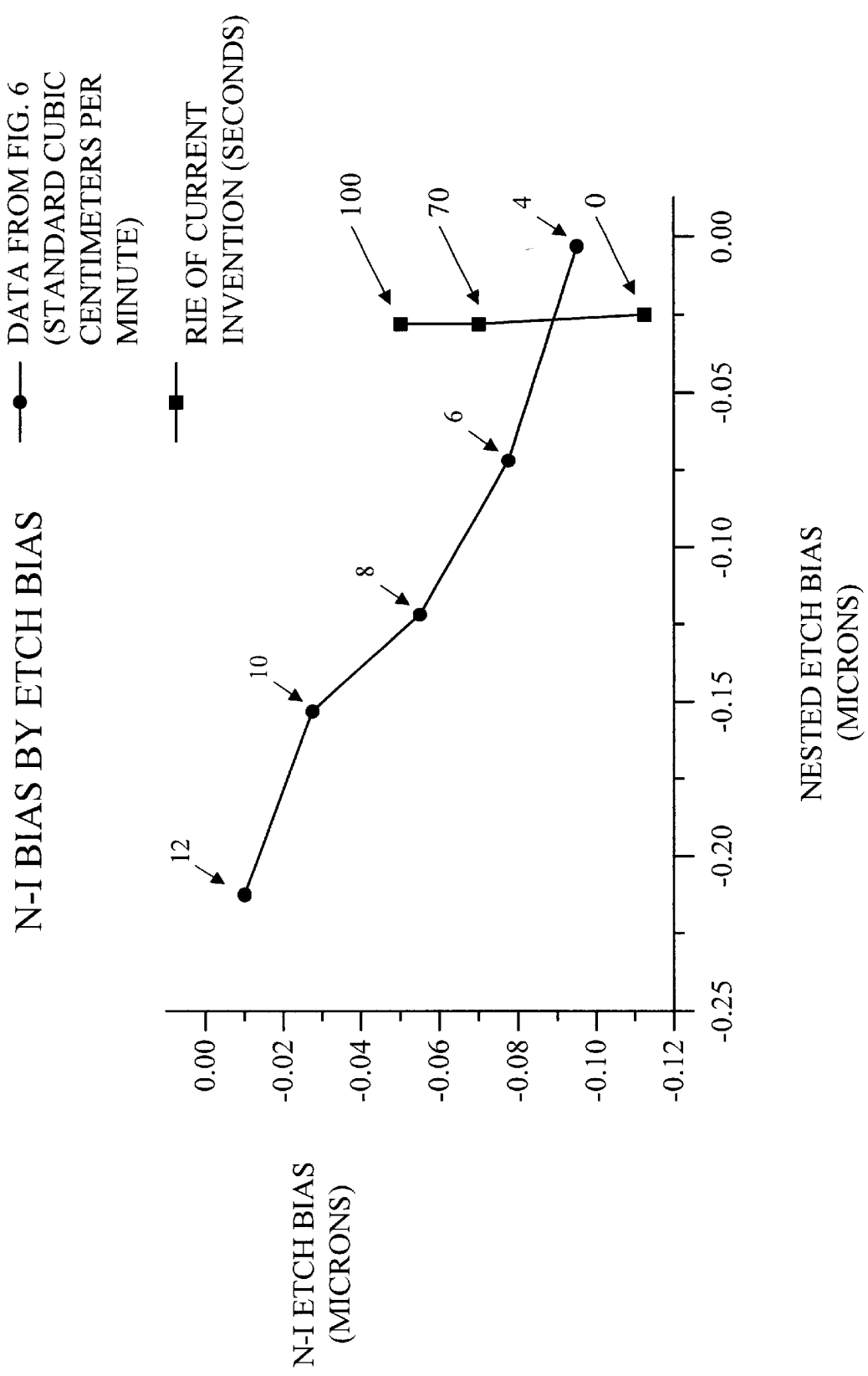
FIG. 4 is a graph of nested to isolated bias compared to nested bias for a preferred RIE used to modify an etch mask in accordance with a preferred embodiment of the present invention.

Turning now to FIG. 4, FIG. 4 is a graph of nested to isolated etch bias as compared to nested etch bias for the most preferred embodiment of the present invention. In the most preferred embodiment, the special etch is a modified ash RIE that uses oxygen (the ashing, etching agent) and argon (the sputtering agent) to modify lithographic lines. The most preferred etch of the present invention will be called a "modified ash" etch. The term "modified ash" denotes the oxygen that is used as an etching (or ashing) agent and denotes that the ash is modifying the sizes of nested and isolated structures in an unusual, particular manner (the etch is not a true ashing RIE, which decreases the widths of all structures on a wafer). The different values shown are total time values (in seconds) of ashing. These data were gathered with argon at 28 SCCM (Standard Cubic Centimeters per Minute), oxygen at 7 SCCM, 325 W (Watts) power, and 10 $\mu$m (micrometers) pressure in an eight-inch single wafer reactor in the RIE mode. The reason that these parameters were used for this particular processing line will be discussed in reference to FIGS. 6 and 8. The data were taken by measuring the size of particular lines on wafers after a normal RIE etch (after step 5040 of method 5000) was used to pattern the structures. The RIE is the normal process to etch the underlying structures. The time curve is an indication that nested to isolated etch bias can be made to decrease while nested etch bias is staying relatively constant. The decrease in nested to isolated etch bias is linear in time. This is important because past systems would decrease nested to isolated etch bias at the expense of nested edge bias (in other words, all lines got smaller). The data from FIG. 14 is shown on FIG. 4 for reference. Prior art RIE creates a graph similar to the data from FIG. 14, which is shown for reference on FIG. 4, whereas the modified ash of the current invention can create a line that is much, much steeper.

For the preferred embodiments of the present invention, once the rest of the parameters of the etch have been selected for a particular process line, the parameter of time (how long the etch is performed) should be the only parameter that would normally need to be varied to reduce nested to isolated offsets.

Figure 5:
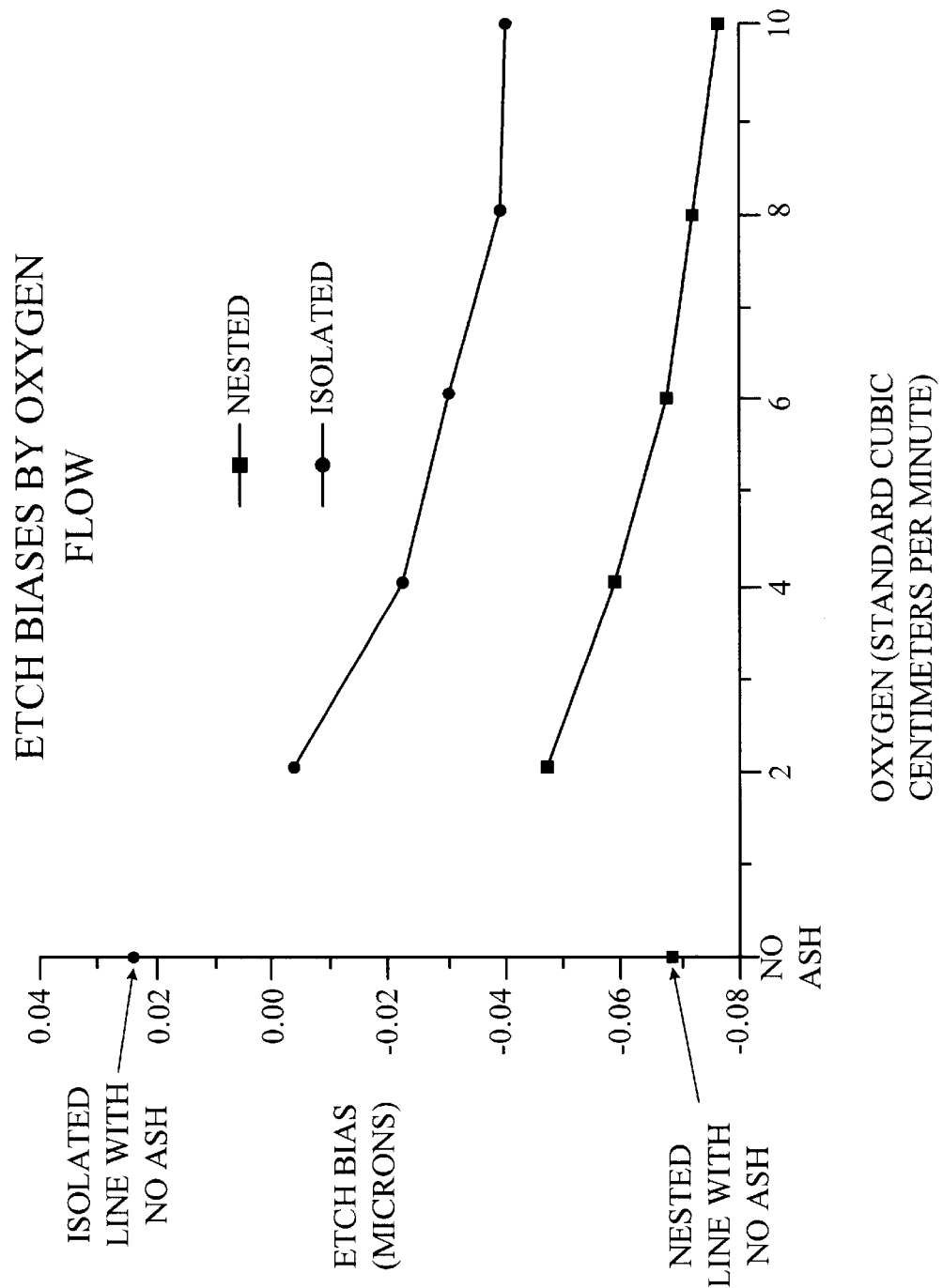
FIG. 5 is a graph of nested to isolated bias compared to nested bias for a referred RIE used to modify an etch mask in accordance with a preferred embodiment of the present invention.

Turning now to FIG. 5, a graph illustrating how etch biases for nested and isolated lines are affected by RIEs using the most preferred etch (modified ash) of the current invention is shown. These data were taken by measuring a certain line or lines on a group of wafers (e.g., with no etching or modified ash step), performing a modified ashing etch on one wafer with a certain amount of oxygen added to argon, performing a normal RIE, measuring the line and deriving the etch bias, performing a modified ash on a second wafer with a certain amount of oxygen added to the ashing mixture, performing a normal RIE, etc. These data were derived by allowing an eight-inch single wafer reactor in the RIE mode to etch with the modified ashing etch of the present invention (at the oxygen flow rates listed on the chart and 28 SCCM argon, 325 W power, 10 $\mu$m pressure) until an optical emission endpoint indicated an increase in oxygen level, then etching for 70 percent of this time thereafter. The increase in oxygen level indicates that the ARC or resist has been depleted and the ash is no longer etching the ARC. An ashing etch is a "controlled burn" that depletes oxygen and generates carbon dioxide and water. Initially, the etch affects the lithographic film that is 100 percent organic (e.g., the photoresist and/or ARC) and "burns" this organic material at a high rate. When the lithographic film is depleted to the underlying materials (oxide, semiconductor, etc.), the ashing etch has much less to etch and "burn." The oxygen level thus increases sharply. This sharp change in oxygen level causes an equivalent change in optical emission, which may be used to trigger a timer. The timer would subsequently run for 70 percent of the time the etch ran until the change in optical emission, then stop the etch. For instance, if the etch ran 100 seconds until the change in optical emission, the etch would run an additional 70 seconds.

The nested and isolated lines on the wafer used for comparison purposes are shown at the "NO ASH" starting point for oxygen flow. The lines or lines at this point have not been subjected to an ashing step. In other words, the data at the "NO ASH" location occurs after step 8020 of method 8000 or after step 5020 of method 5000. The other data plotted in FIG. 5 occur after step 8030 of method 8000 or step 5030 of method 5000.

Figure 6:
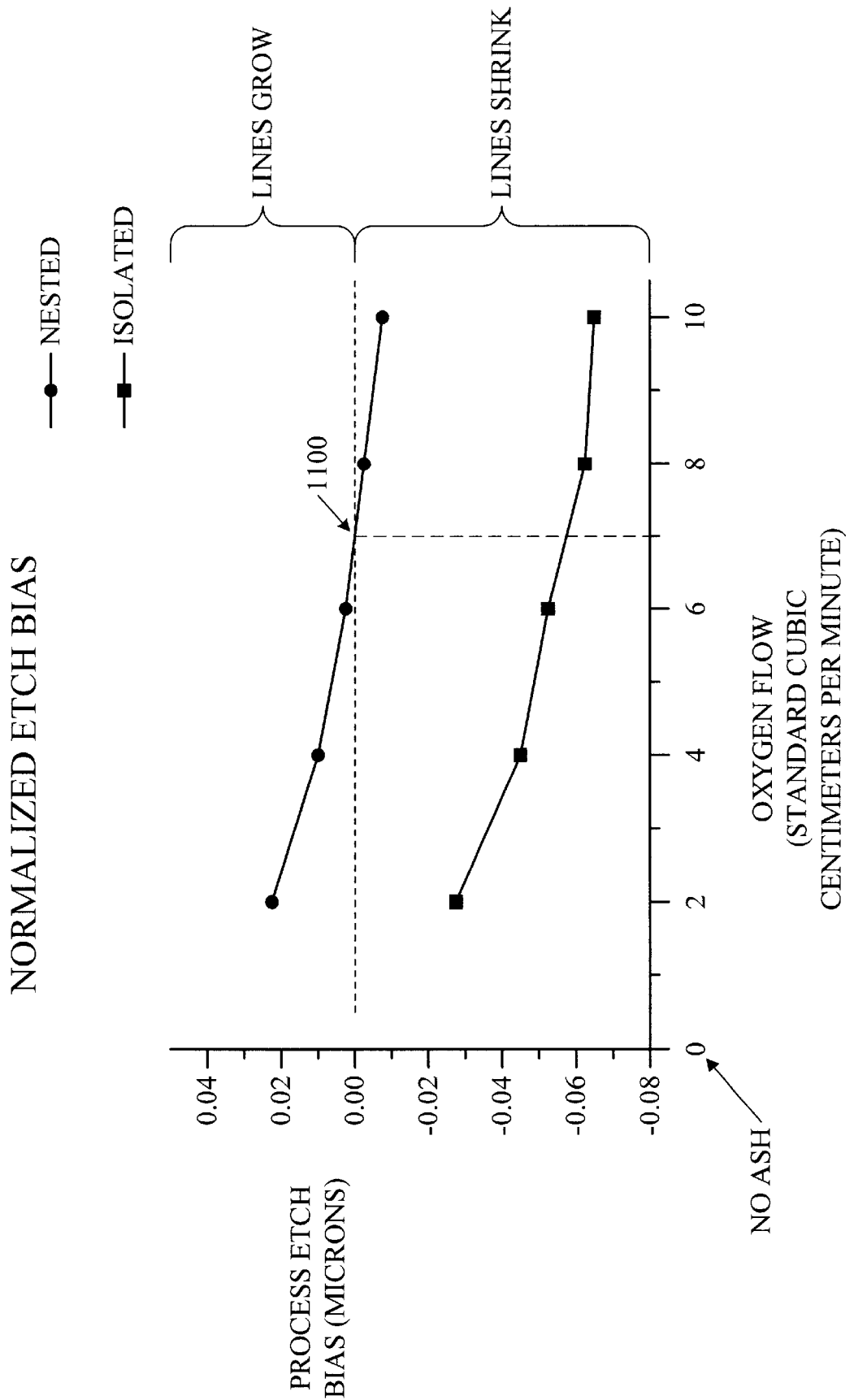
FIG. 6 is a graph of the data of FIG. 5 plotted to show normalized nested to isolated bias compared to nested bias for a preferred RIE used to modify an etch mask in accordance with a preferred embodiment of the present invention.

FIG. 5 illustrates that increasing the oxygen level past a certain level for the modified ash of the present invention will decrease both nested and isolated lines. However, by rearranging the data to reflect the no ash condition as a baseline as FIG. 6 shows, nested lines can be made to actually grow at low oxygen flow levels during the modified ash RIE of the present invention. FIG. 6 graphs normalized etch bias as a function of oxygen flow for modified ash etching. FIG. 6 shows the data in FIG. 5 normalized against the NO ASH data of FIG. 5. The normalization method was to take each data point where the ashing step was applied and subtract the NO ASH datum for that type of line. For instance, subtracting the isolated line with no ash datum (about 0.025 microns) from the isolated line at 2 SCCM oxygen (about zero etch bias) yields the data point at 2 SCCM oxygen in FIG. 6.

Again, the nested lines grow at low oxygen flow while the isolated lines always shrink regardless of the oxygen flow. Thus, by adjusting the ashing component (oxygen), the lines for nested and isolated areas can be equalized such that the normal etch will create zero nested to isolated etch bias. The modified ash step of the present invention mainly modifies the lithographic film and not the underlying lines. Thus, adjusting the modified ash step (step 5030 of method 5000) to increase or decrease the nested lines while decreasing the isolated lines can compensate for the changes made in the nested to isolated offset during the next step of performing a normal etch (step 5040 of method 5000). The combination of the two etches can reduce the etch-induced nested to isolated values to a very small level.

In this particular processing line, reactive ion etching reactor, and process parameters for the ashing etch of the present invention, an oxygen flow of 7 SCCM (indicated by marker 1100 on FIG. 6) will result in no change in the size of nested lines while the isolated lines can be made to shrink. In this processing line, an oxygen flow of 7 SCCM will allow the parameter of etching time to be used to adjust nested to isolated offsets. This is also shown in FIG. 4, where the time of etch was the only parameter changed. Those skilled in the art may adjust the parameters of the etch of the present invention for their own process environment and line, such that in general the only process parameter that need be changed to adjust nested to isolated offsets in accordance with the present invention is etching time.

Figure 7:
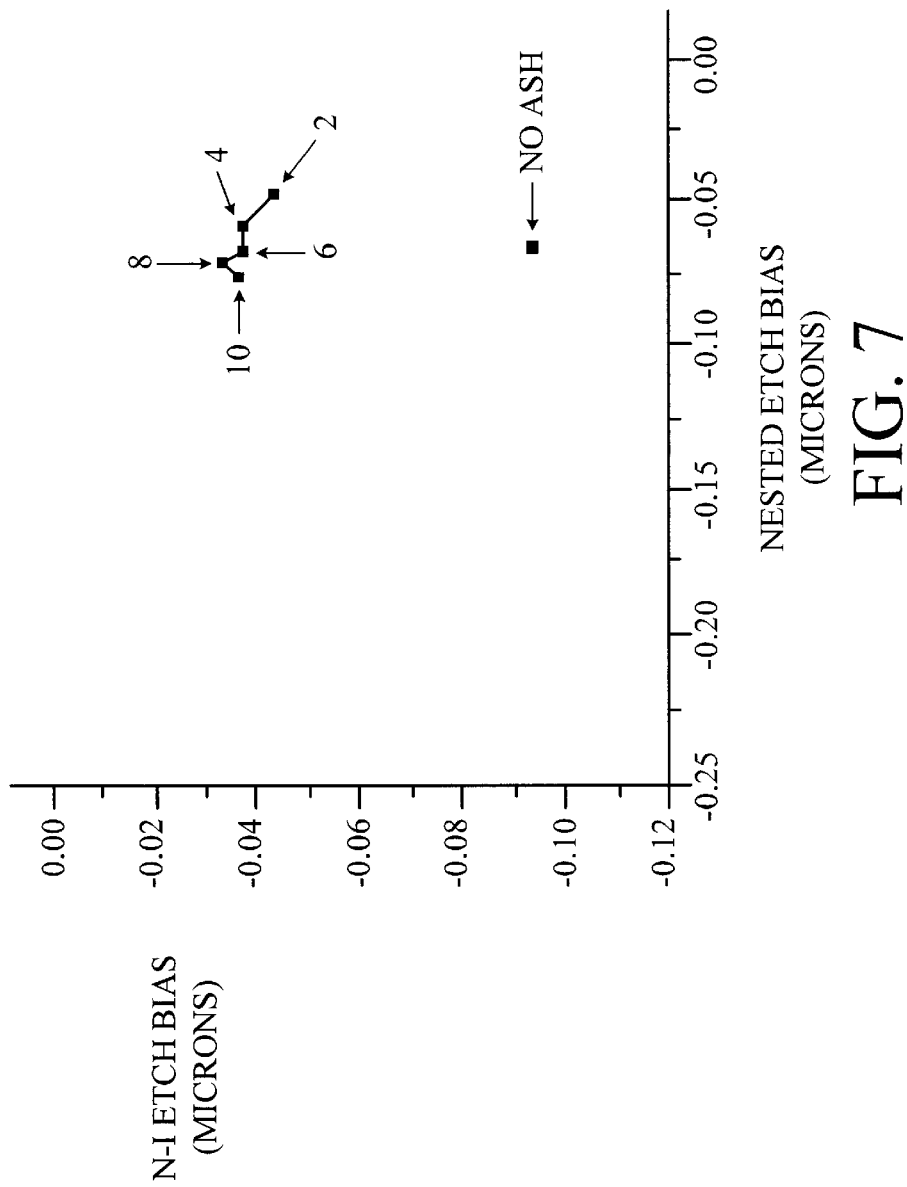
FIG. 7 is a graph of the data of FIG. 6 that shows nested to isolated bias compared to nested bias as a function of oxygen flow for a preferred RIE used to modify an etch mask in accordance with a preferred embodiment of the present invention.

Referring now to FIG. 7, the data from FIG. 6 is plotted with different abscissae. As stated previously (in reference to FIG. 5), these data were taken by allowing an eight-inch single wafer reactor in the RIE mode to etch with the modified ashing etch of the present invention until an optical emission endpoint indicated an increase in oxygen level, then etching for 70 percent of this time thereafter. FIG. 7 shows how nested to isolated bias changes as nested bias changes. The NO ASH point is also graphed for comparison. Comparing FIG. 7 with FIG. 14, it can be seen that biases do not change nearly as much as in FIG. 14. In FIG. 14, increasing the oxygen level does decrease the nested to isolated offset, but this comes at a tremendous price in nested (and isolated) line sizes: nested etch bias decreases over 0.2 microns. Conversely in FIG. 7, increasing the oxygen level decreases the nested etch bias very little (less than 0.05 microns) over the entire range of oxygen flow rates, while the nested to isolated offset is decreased (from about 0.09 microns to about 0.04 microns). A large amount of variance in oxygen flow still allows decreased nested to isolated offsets. Further improvements in nested to isolated offset may be made by changing other parameters of the modified ash RIE of the present invention.

Figure 8:
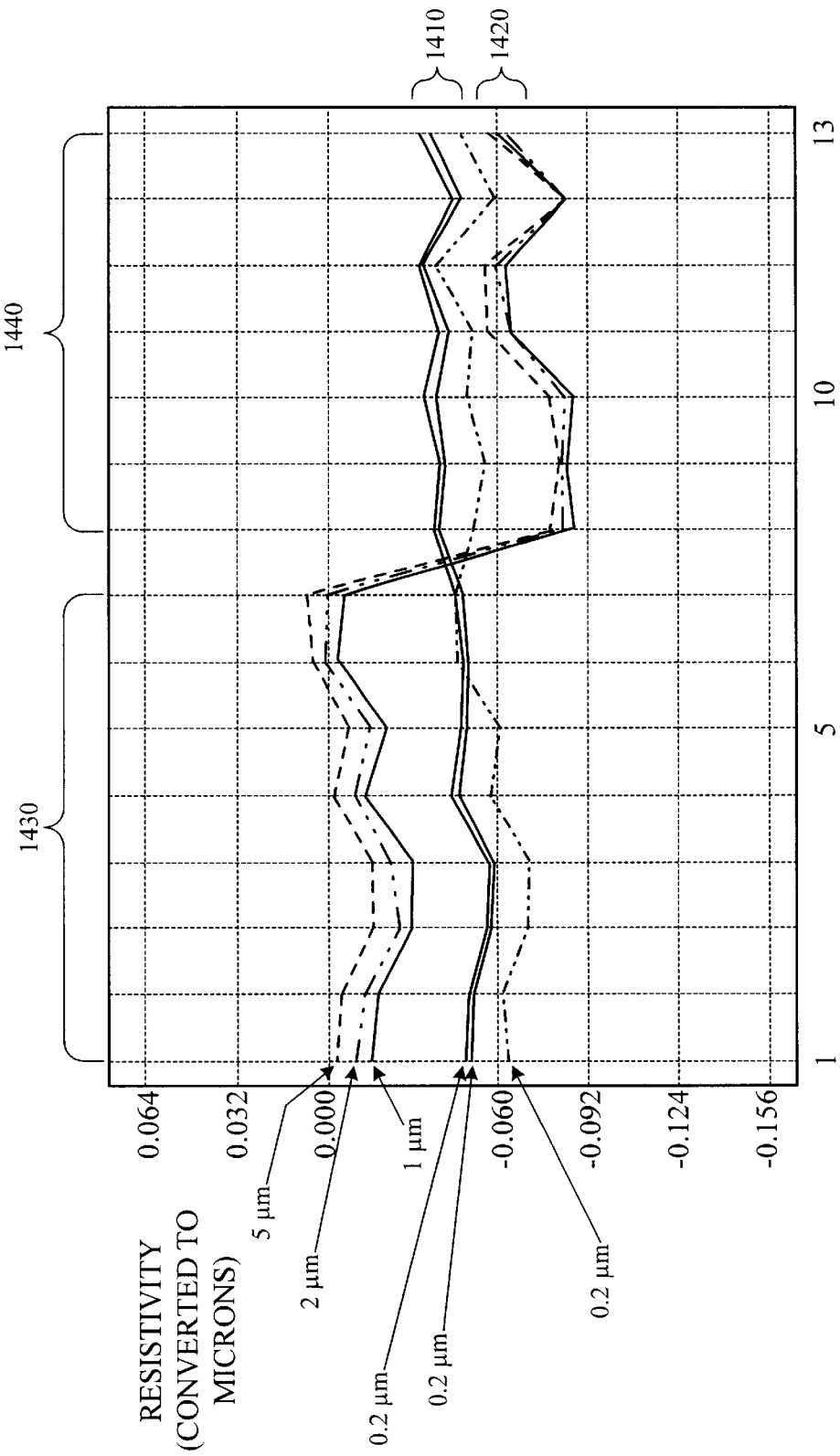
FIG. 8 is a graph comparing electrical resistivity data for RIEs performed with and without the methods of the present invention for various lines on a multitude of wafers.

Turning now to FIG. 8, this figure shows how the resistivity of certain isolated and nested lines changes with the modified ash RIE of the present invention. In FIG. 8, the resistivity of a number of lines on a number of wafers was measured. Lines 1420 were isolated lines, while lines 1410 were nested lines. The first three spacings were considered to be nested, while the second three spacings were considered to be isolated. The individual lines were different distances from neighboring lines; this distance qualified the lines as being nested or isolated. The spacing between the line that was measured and its nearest neighboring line is indicated on the figure. Three lines of 0.2 $\mu$m spaces were measured in varying density fields. In other words, these data were taken in locations where there were different number of lines per area, and each line measured had nearest neighbors that were 0.2 $\mu$m away. Three other lines that were deemed isolated were measured: one line each of 1 $\mu$m, 2 $\mu$m, and 5 $\mu$m (this is the spacing between the line that was used for the data and its nearest neighboring line). Wafers 1430 are wafers measured after a normal RIE but with no modified ash RIE; wafers 1440 are wafers measured after both a normal RIE and the modified ash RIE of the present invention. While the resistivity of the nested lines remain relatively constant for both wafers 1430 and 1440, the resistivity of the isolated lines changes dramatically. The resistivity of the isolated lines for wafers 1440 (subjected to both the modified ash and normal RIE) is much closer to the resistivity of the nested lines and is much lower than resistivity of the same lines when not subjected to the modified ash of the present invention. Thus, while nested lines are relatively unchanged, isolated lines are changed dramatically. The nested to isolated offset can be inverted using the modified ash of the present invention. FIG. 8 illustrates that using the ash of the present invention allows compensation over the entire range of spacings between lines on a wafer for etch-induced nested to isolated changes that occur in a normal, subsequent etch step.

Although the current invention has been described in reference to the most preferred special etch being a modified ashing etch (comprising argon and oxygen) that is used to etch a lithographic film, other RIEs are possible that etch other surfaces. The present invention is generally applicable to other surfaces and chemistries as long as there is a high sputtering component and an isotropic etchant. For instance, fluorine used as the etchant with argon used as a sputtering component can etch an oxide etch mask, and this etch can adjust nested to isolated etch mask lines prior to the normal RIB etch. Similarly, chlorine used as the etchant with argon used as a sputtering component can etch a silicon/polysilicon etch mask and adjust the etch mask lines prior to the normal etch. The processes of creating oxide and silicon/polysilicon etch masks are well known in the art.

As shown in the previous figures, the present invention provides a method for applying a RIE environment having a sputtering component and an etching component to selectively modify nested and isolated etch mask lines. Nested etch mask lines can increase in or remain the same width, while isolated lines decrease in width. Modifying nested and isolated lines prior to a normal etch should eliminate or substantially reduce the nested to isolated offset left after the normal etch. Using the special etch of the present invention prior to normal etching affects the etch mask while generally not affecting the substrate the etch mask. The relative amounts of ashing and sputtering species in the ash can be modified to selectively change the size of isolated and nested lines such that the next etching step will then cause the nested to isolated offset to be zero.

Thus, the preferred embodiments capitalize on the unique combination of ashing and sputtering component of an ash to reduce nested to isolated offsets. The etch mask lines are modified while the layers underlying the etch mask lines are not generally etched. While the invention has been particularly shown and described with reference to exemplary embodiments using argon and oxygen, those skilled in the art will recognize that the preferred embodiments can be applied to other RIE applications with similar ashing and sputtering components and that various changes in form and details may be made therein without departing from the spirit and scope of the invention.

What is claimed is:

1. A method for modifying nested to isolated offsets, the method comprising the steps of:

a) forming an etch mask on the substrate;

b) patterning the etch mask to create nested and isolated etch mask lines on the substrate;

c) etching the substrate under conditions such that the widths of the nested and isolated etch mask lines are modified; and d) etching the substrate to create nested and isolated lines in the substrate.

2. The method of claim 1 wherein, during the step of etching the substrate under conditions such that the widths of the nested and isolated etch mask lines are modified, the widths of the nested etch mask lines remain relatively constant while the widths of the isolated etch mask lines decrease.

3. The method of claim 1 wherein, during the step of etching the substrate under conditions such that the widths of the nested and isolated etch mask lines are modified, the widths of the nested etch mask lines increase while the widths of the isolated etch mask lines decrease.

4. The method of claim 1 wherein the step of etching the substrate under conditions such that the widths of the nested and isolated etch mask lines are modified comprises a reactive ion etch wherein the conditions comprise a ratio of etching and sputtering components.

5. The method of claim 4 wherein the etch mask comprises a lithographic film, wherein the etching component is oxygen, and wherein the sputtering component is argon.

6. The method of claim 4 wherein the etch mask comprises an oxide, wherein the etching component is fluorine, and wherein the sputtering component is argon.

7. The method of claim 4 wherein the etch mask comprises polysilicon, wherein the etching component is chlorine, and wherein the sputtering component is argon.

8. The method of claim 4 wherein the etch mask comprises silicon, wherein the etching component is chlorine, and wherein the sputtering component is argon.

9. The method of claim 1 wherein the step of etching the substrate under conditions such that the widths of the nested and isolated etch mask lines are modified modifies the widths of the nested to isolated etch mask lines such that after the step of etching the substrate to create nested and isolated lines in the substrate the nested to isolated offset will be low.

10. The method of claim 1 wherein the step of etching the substrate under conditions such that the widths of the nested and isolated etch mask lines are modified modifies the widths of the nested to isolated etch mask lines to compensate for the changes in widths of the nested to isolated lines created in the substrate by the step of etching the substrate to create nested and isolated lines in the substrate.

11. The method of claim 1 wherein the step of etching the substrate under conditions such that the widths of the nested and isolated etch mask lines are modified comprises a first etch, wherein the step of etching the substrate to create nested and isolated lines in the substrate comprises a second etch, and wherein the first etch modifies the widths of the nested and isolated etch mask lines such that the second etch will result in an overall lower nested to isolated offset than would have occurred had only the second etch been performed on the substrate.

12. The method of claim 1 wherein the substrate comprises at least one layer on a wafer.

13. A method for modifying nested to isolated offsets, the method comprising the steps of:

a) depositing a lithographic film on the substrate;

b) patterning the lithographic film to create nested and isolated lithographic lines on the substrate;

c) reactive ion etching the substrate under conditions such that the widths of the nested and isolated lithographic lines are modified to compensate for changes in widths of nested and isolated lines that will be caused by etching the substrate in a second reactive ion etching environment; and d) etching the substrate in the second reactive ion etching environment to create nested and isolated lines in the substrate.

14. The method of claim 13 wherein, during the step of reactive ion etching the substrate under conditions such that the widths of the nested and isolated lithographic lines are modified, the widths of the nested lithographic lines remain relatively constant while the widths of the isolated lithographic lines decrease.

15. The method of claim 13 wherein, during the step of reactive ion etching the substrate under conditions such that the widths of the nested and isolated lithographic lines are modified, the widths of the nested lithographic lines increase while the widths of the isolated lithographic lines decrease.

16. The method of claim 13 wherein the step of reactive ion etching the substrate under conditions such that the widths of the nested and isolated lithographic lines are modified modifies the widths of the nested to isolated lithographic lines such that after the step of etching the substrate in the second reactive ion etching environment to create nested and isolated lines in the substrate the nested to isolated offset will be low.

17. The method of claim 13 wherein the step of etching the substrate under conditions such that the widths of the nested and isolated etch mask lines are modified modifies the widths of the nested to isolated lithographic lines to compensate for the changes in widths of the nested to isolated lines created in the substrate by the step of etching the substrate in the second reactive ion etching environment to create nested and isolated lines in the substrate.

18. The method of claim 13 wherein the step of reactive ion etching the substrate under conditions such that the widths of the nested and isolated lithographic lines are modified comprises a first etch, wherein the step of etching the substrate in the second reactive ion etching environment to create nested and isolated lines in the substrate comprises a second etch, and wherein the first etch modifies the widths of the nested and isolated lithographic lines such that the second etch will result in an overall lower nested to isolated offset of nested and isolated lines in the substrate than would have occurred had only the second etch been performed on the substrate.

19. The method of claim 13 wherein the substrate comprises at least one layer on a wafer.

20. A method for decreasing nested to isolated offsets, the method comprising the steps of:

a) depositing a lithographic film on the substrate;

b) patterning the lithographic film to create the nested and isolated lines on the substrate;

c) etching the substrate in a first reactive ion etching environment comprising a ratio of etching and sputtering components, wherein the step of etching the substrate in a first reactive ion etching environment modifies the widths of nested and isolated lithographic lines such that etching the substrate in a second reactive ion etching environment will result in low nested to isolated offset for the nested and isolated lines, wherein the step of etching the substrate in a first reactive ion etching environment modifies the widths of nested and isolated lithographic lines to compensate for the changes in widths of nested and isolated lines that will be created by etching the substrate in a second reactive ion etching environment; and d) etching the substrate in the second reactive ion etching environment to create the nested and isolate lines in the substrate.

21. The method of claim 20 further comprising the steps of:

e) determining the widths of at least one nested line and at least one isolated line for similar devices on the substrate;

f) adjusting the parameters of the first reactive ion etching environment if the widths of the at least one nested line and at least one isolated line do not meet a desired difference; and g) performing steps a through f with other substrates until the widths of the at least one nested line and the at least one isolated line meet the desired difference.

22. The method of claim 20 wherein, during the step of etching the substrate in a first reactive ion etching environment comprising a ratio of etching and sputtering components, the widths of the nested lithographic lines remain relatively constant while the widths of the isolated lithographic lines decrease.

23. The method of claim 20 wherein, during the step of etching the substrate in a first reactive ion etching environment comprising a ratio of etching and sputtering components, the widths of the nested lithographic lines increase while the widths of the isolated lithographic lines decrease.

24. The method of claim 20 wherein the step of etching the substrate in a first reactive ion etching environment comprising a ratio of etching and sputtering components comprises a first etch, wherein the step etching the substrate in the second reactive ion etching environment to create the nested and isolate lines in the substrate comprises a second etch, and wherein the first etch modifies the widths of the nested and isolated lithographic lines such that the second etch will result in an overall lower nested to isolated offset of nested and isolated lines in the substrate than would have occurred had only the second etch been performed on the substrate.

25. The method of claim 20 wherein the substrate comprises at least one layer on a wafer.

* * * * *